(12) United States Patent
Rahman

(10) Patent No.: US 7,130,359 B2
(45) Date of Patent: Oct. 31, 2006

(54) SELF CALIBRATING RECEIVE PATH CORRECTION SYSTEM IN A RECEIVER

(75) Inventor: Mahibur Rahman, Lake Worth, FL (US)

(73) Assignee: Motorola Inc., Schaumburg, IL (US)

( * ) Notice: Subject to any disclaimer, the term of this patent is extended or adjusted under 35 U.S.C. 154(b) by 1085 days.

(21) Appl. No.: 10/096,461

(22) Filed: Mar. 12, 2002

(65) Prior Publication Data

US 2003/0174641 A1    Sep. 18, 2003

(51) Int. Cl.
*H03K 9/00* (2006.01)

(52) U.S. Cl. .................. 375/316; 375/345; 375/319; 455/130; 455/232

(58) Field of Classification Search .............. 375/316, 375/261, 324, 147, 235; 455/234.1, 255, 455/324; 324/76.78; 340/7.38; 342/174
See application file for complete search history.

(56) References Cited

U.S. PATENT DOCUMENTS

| | | | | |
|---|---|---|---|---|
| 4,122,448 A | * | 10/1978 | Martin | 342/174 |
| 5,263,196 A | * | 11/1993 | Jasper | 455/324 |
| 5,530,911 A | * | 6/1996 | Lerner et al. | 340/7.38 |
| 5,697,082 A | * | 12/1997 | Greer et al. | 455/255 |
| 5,949,821 A | * | 9/1999 | Emami et al. | 375/235 |
| 6,044,112 A | * | 3/2000 | Koslov | 375/235 |
| 6,122,325 A | * | 9/2000 | Mogre et al. | 375/261 |
| 6,330,290 B1 | * | 12/2001 | Glas | 375/324 |
| 6,340,883 B1 | * | 1/2002 | Nara et al. | 324/76.78 |
| 2003/0007574 A1 | * | 1/2003 | Li et al. | 375/316 |
| 2003/0095589 A1 | * | 5/2003 | Jeong | 375/147 |
| 2003/0174783 A1 | * | 9/2003 | Rahman et al. | 375/298 |
| 2003/0207674 A1 | * | 11/2003 | Hughes | 455/234.1 |
| 2003/0207675 A1 | * | 11/2003 | Hughes et al. | 455/234.1 |

* cited by examiner

Primary Examiner—Tesfaldet Bocure
Assistant Examiner—Sudhanshu C. Pathak
(74) Attorney, Agent, or Firm—Randi L. Karpinia; Sylvia Chen; Douglas S. Rupert

(57) ABSTRACT

A receiver (50) includes a self-calibrating receive path correction system for correction of I/Q gain and phase imbalances in a radio frequency signal. The system includes a signal-processing block (53), an I/Q phase imbalance detection and correction circuit (98), an I/Q gain imbalance detection and correction circuit (96), and an adaptive loop bandwidth control circuit (102). The I/Q phase imbalance detection and correction circuit (98) equalizes for the relative phase imbalance and the I/Q gain imbalance detection and correction circuit (96) equalizes for the relative gain imbalance between the I and Q channels created by the analog portion of a quadrature receiver. The adaptive loop bandwidth control circuit (102) dynamically adjusts at least one loop bandwidth for the I/Q gain imbalance detection and correction circuit (96) and the I/Q phase imbalance detection and correction circuit (98) on a slot boundary.

15 Claims, 7 Drawing Sheets

SELF CALIBRATING RECEIVE PATH CORRECTION SYSTEM IN A RECEIVER

BACKGROUND OF THE INVENTION

1. Field of the Invention

This invention relates in general to communication devices and in particular to communication devices incorporating a receive signal path correction system with self-calibration capabilities.

2. Description of the Related Art

Gain and phase imbalances between the I and Q quadrature channels of a receive signal path of a communication device occur because of inherent circuit level mismatches between analog circuits in these quadrature signal paths. This can significantly degrade the detectability of the received signal under both static as well as multipath fading channel conditions for both Zero Intermediate Frequency (IF) as well as Very Low Intermediate Frequency (VLIF) receivers. In addition, in the case of VLIF receivers, the performance of these receivers is highly dependent on the suppression of the image signal. Suppression of the image signal in such receivers can be significantly improved by eliminating these gain and phase imbalances.

Traditionally, it has been difficult to achieve such I/Q performance without performing open loop factory calibration steps. This is unfortunately an expensive approach as it adds to production cost and time. Even if factory calibration is performed, it is difficult to preserve the factory correction performance over temperature, supply voltage, and channel frequency variations over the life of the wireless product. This is because after a one-time factory correction is performed to correct for the specified imbalances, these imbalances can vary over temperature, supply voltage, and channel frequencies.

FIG. 1 illustrates a block diagram of a conventional receive signal path 10 within a communication device. As illustrated a complex communication signal 12 is received by the communication device and de-interleaved by a demodulator 14 into an I-channel received signal 16 and a Q-channel received signal 18. The demodulator 14 typically includes one or more quadrature receive mixers 20,22 receiving inputs from a conventional local oscillator 24. Typically the quadrature receive mixers 20,22 convert the complex communication signal 12 to the I-channel received signal 16 and the Q-channel received signal 18, which are baseband signals, using the conventional local oscillator 24. The I-channel received signal 16 is then processed through an I-channel post mixer amplifier (PMA) 26, which provides programmable gain to amplify the baseband signal. Next, the amplified signal is processed through a conventional I-channel anti-aliasing filter (AAF) 30, which provides attenuation to out of band frequencies. Next, a conventional I-channel analog to digital converter (A/D) 32 converts the signal from an analog format to a digital format, to produce a processed I-channel signal 34. Similarly, the Q-channel received signal 18 is processed through a Q-channel post mixer amplifier (PMA) 36 which provides programmable gain to amplify the baseband signal. The amplified signal is processed through a conventional Q-channel anti-aliasing filter (AAF) 40, which provides attenuation to out of band frequencies. Next, a conventional Q-channel analog to digital converter (A/D) 42 converts the signal from an analog format to a digital format, to produce a processed Q-channel signal 44.

Potential sources of I/Q gain and phase imbalances in the receive signal path 10 of a communication device include the quadrature receive mixers 20,22, the I-channel post mixer amplifier 26, the Q-channel post mixer amplifier 36, the conventional I-channel anti-aliasing filter 30, the conventional Q-channel anti-aliasing filter 40, the I-channel analog-to-digital converter 32 and the Q-channel analog-to-digital converter 42. The total gain imbalance due to these circuits can exceed 4 dB over process, temperature, and supply voltage variations. For phase modulated spread spectrum communications protocols, such as WCDMA, it is desired that this gain imbalance be controlled to less than 0.8 dB to preserve BER performance under static and multipath fading conditions. For amplitude-modulated systems, the gain imbalance requirements are even more stringent.

In addition, the dominant sources of I/Q phase imbalances are due to the quadrature receive mixers 20, 22, the conventional I-channel anti-aliasing filter 30, and the conventional Q-channel anti-aliasing filter 40. The conventional local oscillator 24 causes the majority of the phase imbalance at the output of the quadrature receive mixers 20, 22. The total phase imbalance due to these circuits can exceed 10 degrees over process, temperature, supply voltage, and channel frequency variations. For phase modulated systems such as Code Division Multiple Access (CDMA) and Global System for Mobile Communications (GSM)/Enhanced Data rates for GSM Evolution (EDGE), it is desired that this phase imbalance be controlled to less than 3 degrees to preserve BER performance under static and multipath fading conditions.

Therefore, what is needed is a high performance, low cost and low power system for correction of I/Q quadrature gain and phase imbalances in the receive signal path of a communication device.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE PREFERRED EMBODIMENT(S)

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Figure 1:
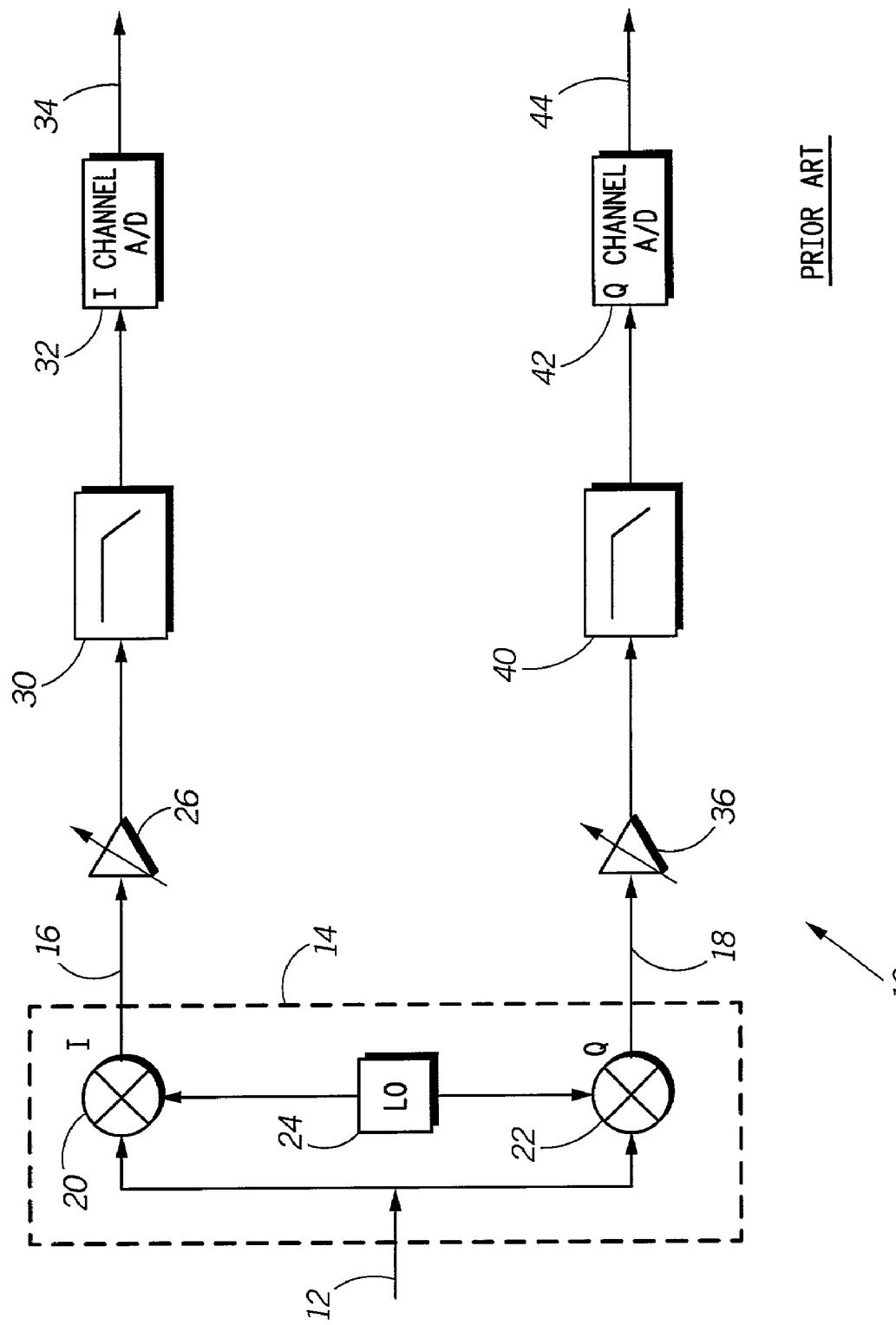
FIG. 1 illustrates a block diagram of a conventional receive signal path within a communication device.
Figure 2:
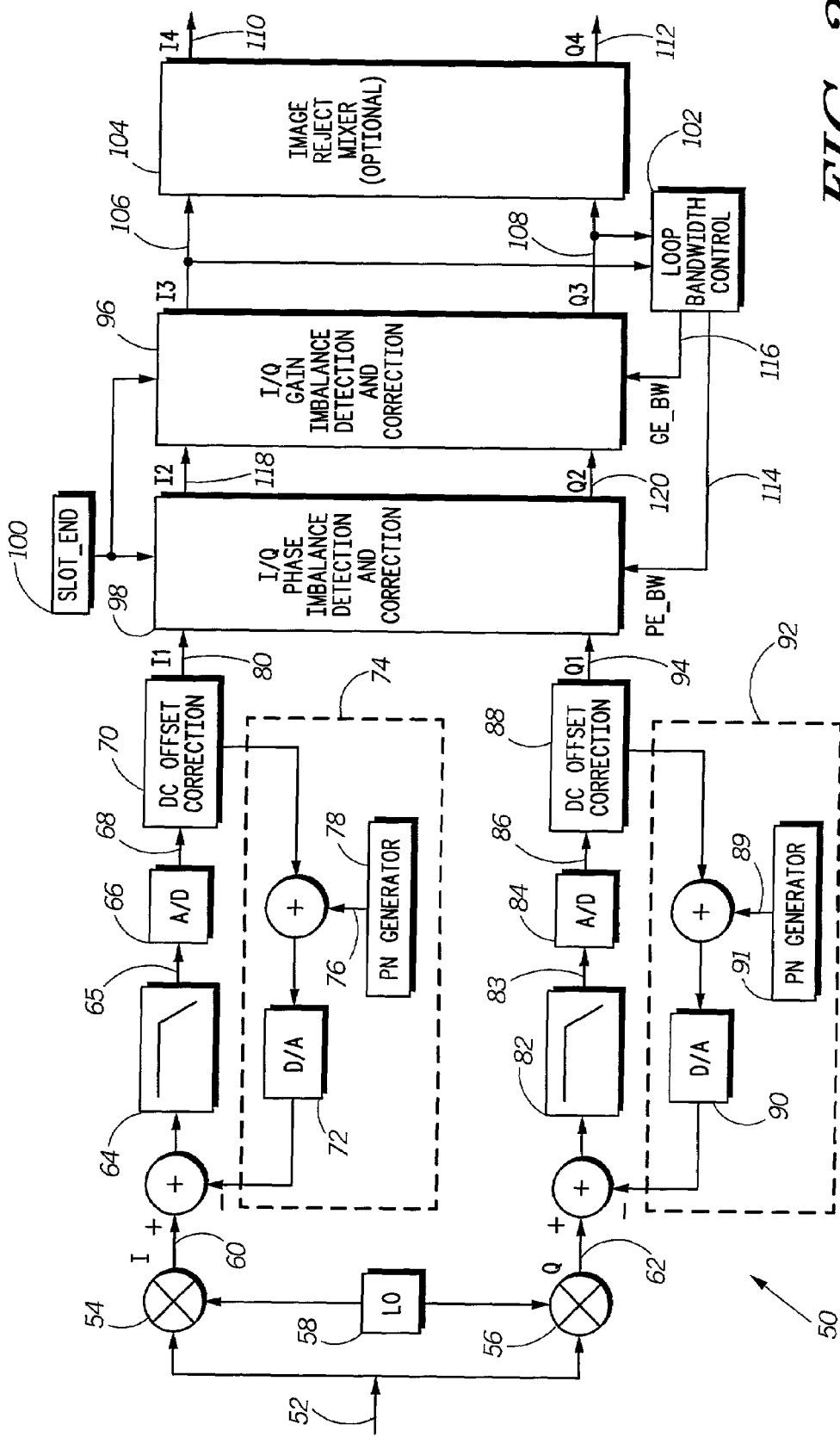
FIG. 2 illustrates an electronic block diagram of a receiver, in accordance with the preferred embodiment of the present invention.

FIG. 2 illustrates an electronic block diagram of a receiver 50 for correction of I/Q quadrature gain and phase imbalances in the receive signal path of a communication device in accordance with the preferred embodiment of the present invention. The receiver 50 preferably comprises a Zero IF (ZIF) or Very low IF (VLIF) topology at baseband. It will be appreciated by one of ordinary skill in the art that Zero IF and VLIF receivers provide cost, current drain, and performance advantages over other configurations for devices in which they are utilized. Further, it will be appreciated by one of ordinary skill in the art that other equivalent receiver topologies can be implemented in accordance with the present invention.

As illustrated in FIG. 2, the receiver 50 intercepts a RF signal 52 typically sent from a RF communication system. It will be appreciated by one of ordinary skill in the art that the RF communication system, in accordance with the present invention, can function utilizing any wireless radio frequency (RF) channel, for example, a one or two-way pager channel, a mobile cellular telephone channel, or a mobile radio channel. The receiver 50 preferably includes a signal-processing block 53 for processing the received RF signal 52 to produce an unequalized I-signal 80 and an unequalized Q-signal 94. In the signal-processing block 53, using an input from a local oscillator 58, an I-quadrature mixer 54 and a Q-quadrature mixer 56 down convert and separate the RF signal 52. The output of the I-quadrature mixer 54 is an I-signal component 60 of the RF signal 52 converted to either 0 Hz (for ZIF receiver) or a very low IF frequency (for VLIF receiver). Similarly, the output of the Q-quadrature mixer 56 is a Q-signal component 62 of the RF signal 52 converted to either 0 Hz (for ZIF receiver) or a very low IF frequency (for VLIF receiver).

In one embodiment, the I-signal component 60 is processed through an I-channel post mixer amplifier (PMA) (not shown), which provides programmable gain to amplify the baseband signal. The I-signal component 60 is then processed through an I-channel anti-aliasing filter (AAF) 64, which provides attenuation to out of band frequencies, thereby producing an I-channel filtered signal 65. Next, an I-channel analog to digital converter (A/D) 66 converts the I-channel filtered signal 65 from an analog format to a digital format, to produce an I-channel digital signal 68. Next, an I-channel digital offset correction circuit 70 is used at the A/D output to correct for DC offsets of the I-channel digital signal 68, created at the input to the I-channel anti-aliasing filter 64. It is preferable to remove DC offsets in an adaptive manner to preserve the dynamic range of the I-channel anti-aliasing filter 64 and the I-channel A/D converter 66. An I-channel D/A converter 72 is employed in the I-channel feedback path 74 to correct for the analog offsets at the input to the I-channel anti-aliasing filter 64. Preferably, and in accordance with the present invention, an I-channel digital PN training signal 76 is generated by an I-channel PN generator 78 (prior to the I-channel D/A converter 72) in the I-channel feedback path 74 of this control loop. In summary, the output of the I-channel digital offset correction circuit 70 is combined with the I-channel digital PN training signal 76 to produce a self-calibration signal for I/Q imbalance correction. For example, the processing of the I-signal component 60 produces a self-calibration signal for the I-channel, referred to herein as the unequalized I-signal 80.

In one embodiment, the Q-signal component 62 is processed through a Q-channel post mixer amplifier (PMA) (not shown), which provides programmable gain to amplify the baseband signal. The Q-signal component 62 is then processed through a Q-channel anti-aliasing filter (AAF) 82, which provides attenuation to out of band frequencies, thereby producing a Q-channel filtered signal 83. Next, a Q-channel analog to digital converter (A/D) 84 converts the Q-channel filtered signal 83 from an analog format to a digital format, to produce a Q-channel digital signal 86. Next, a Q-channel digital offset correction circuit 88 is used at the A/D output to correct for DC offsets of the Q-channel digital signal 86, created at the input to the Q-channel anti-aliasing filter 82. It is preferable to remove DC offsets in an adaptive manner to preserve the dynamic range of the Q-channel anti-aliasing filter 82 and the Q-channel A/D converter 84. A Q-channel D/A converter 90 is employed in the Q-channel feedback path 92 to correct for the analog offsets at the input to the Q-channel anti-aliasing filter 82. Preferably, and in accordance with the present invention, a Q-channel digital PN training signal 89 generated by a Q-channel PN generator 91 (prior to the Q-channel D/A converter 90) in the Q-channel feedback path 92 of this control loop. It will be appreciated by those of ordinary skill in the art that although the Q-channel digital PN training signal 89 generated by the Q-channel PN generator 91 is illustrated and described herein as separate from the I-channel digital PN training signal 76 generated by the I-channel PN generator 78, alternatively, and in accordance with the present invention, both PN training signals can be generated from the same PN generator and/or both PN training signals can be the same signal. In summary, the output of the Q-channel digital offset correction circuit 88 is combined with the Q-channel digital PN training signal 89 to produce a self-calibration signal for I/Q imbalance correction. For example, the processing of the q-signal component 62 produces a self-calibration signal for the Q-channel, referred to herein as the unequalized Q-signal 94.

After DC offset correction, and in accordance with the present invention, the I-channel digital PN training signal 76 and the Q-channel PN training signal 89 can be used for self-calibration of the I/Q equalization circuitry (to be discussed herein) during warm-up sequences to quickly compensate for those quadrature imbalances due to the I-channel anti-aliasing filter 64, the Q-channel anti-aliasing filter 82, the I-channel analog to digital converter 66, and the Q-channel analog to digital converter 84. This is achieved by running the equalization circuits in a high loop bandwidth mode during such warm-up sequences. The compensation for those I/Q imbalances due to the I-quadrature mixer 54, the Q-quadrature mixer 56, amplifiers, and baseband gain control stages is performed during data reception in a low bandwidth mode in the correction circuits.

Preferably, the unequalized I-signal 80 and the unequalized Q-signal 94 are fed through an I/Q gain imbalance detection and correction circuit 96 and an I/Q phase imbalance detection and correction circuit 98 to compensate for the specified imbalances over process, temperature, and supply voltage variations. First, the phase of the unequalized I-signal 80 and the unequalized Q-signal 94 is equalized using the unequalized I-signal 80 and the unequalized Q-signal 94, resulting in a phase equalized I-signal 118 and a phase equalized Q-signal 120. Then, the phase equalized I-signal 118 and the phase equalized Q-signal 120 are fed into the I/Q gain imbalance detection and correction circuit 96 where the signal gain is equalized, resulting in an I-image signal 106 and a Q-image signal 108. Both the I/Q gain imbalance detection and correction circuit 96 and the I/Q phase imbalance detection and correction circuit 98 use a SLOT_END control signal 100 to detect the specified imbalances over a slot period. The correction values are, however, not applied to the feed forward signal path until the next slot to ensure that the relative I/Q gain and phase relationship does not change dynamically at the input to the signal detector during a slot period. This preserves the BER performance during the specified slot since it can otherwise be difficult for the signal detector to track varying I/Q gain and phase imbalances over the same slot period.

An adaptive loop bandwidth control circuit 102 preferably dynamically adjusts the loop bandwidths (a GE_BW 114 and a PE_BW 116) for the I/Q gain imbalance detection and correction circuit 96 and the I/Q phase imbalance detection and correction circuit 98 on slot boundaries. The adaptive loop bandwidth control circuit 102 allows for more precise acquisition and faster acquisition of the specified I/Q imbalances under both stronger and weaker received signal conditions. The adaptive loop bandwidth control circuit 102, thus, allows for better overall performance in the I/Q gain imbalance detection and correction circuit 96 and the I/Q phase imbalance detection and correction circuit 98 leading to improved BER performance under varying channel conditions.

For the case when the receiver 50 is a VLIF receiver, following the I/Q gain imbalance detection and correction circuit 96 and the I/Q phase imbalance detection and correction circuit 98, the receiver 50 optionally includes an image reject mixer circuit 104 to down-mix the VLIF signal, including the I-image signal 106 and the Q-image signal 108, to 0 Hz center frequency. The output of the image reject mixer circuit 104 is a down-mixed I-signal 110 and a down-mixed Q-signal 112.

Figure 3:
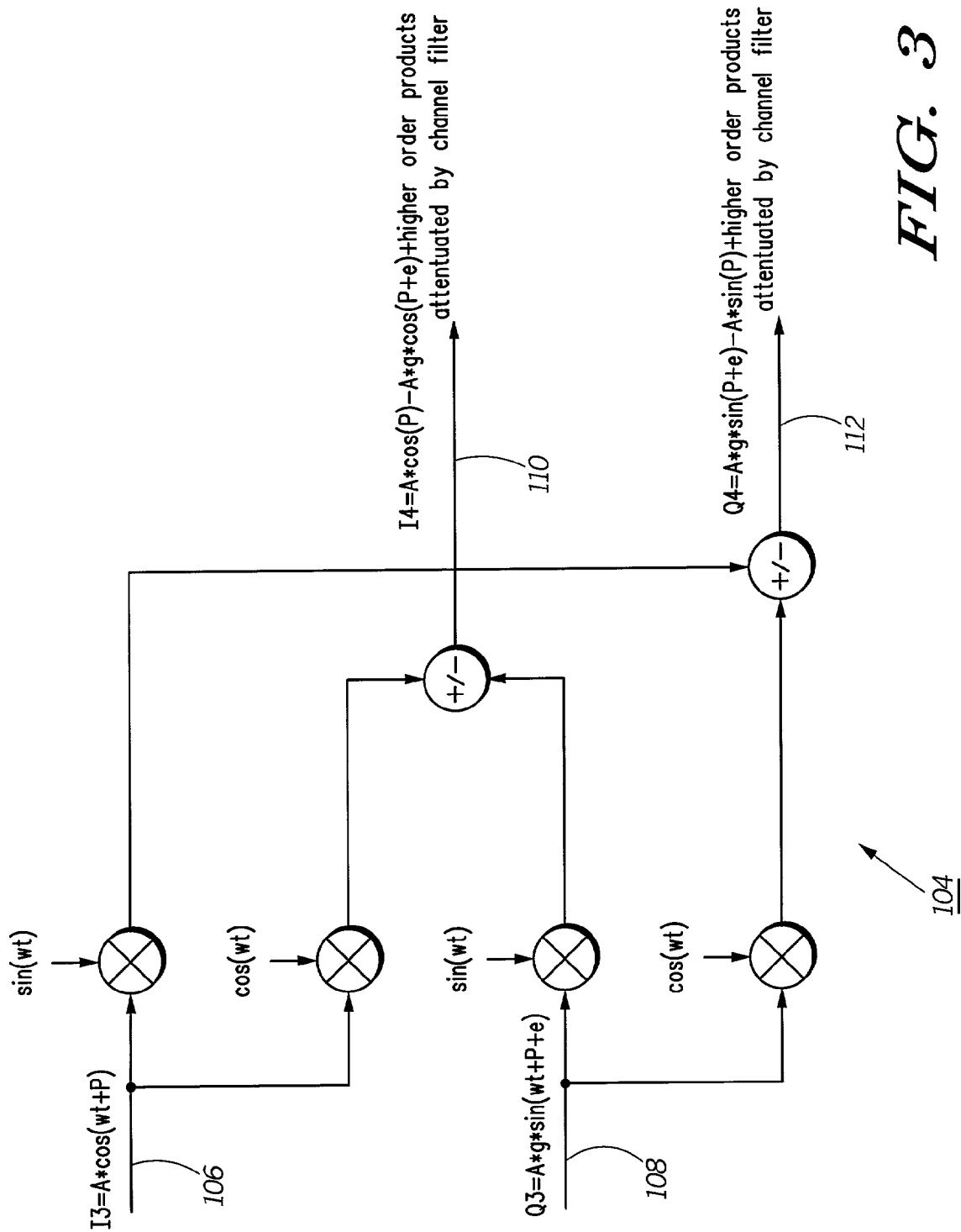
FIG. 3 illustrates the operation of an image reject mixer circuit for use within the receiver of FIG. 2, in accordance with the preferred embodiment of the present invention.

FIG. 3 illustrates the operation of the image reject mixer circuit 104 in accordance with the preferred embodiment of the present invention. The I-image signal 106 and the Q-image signal 108 are illustrated in FIG. 3 as quadrature tones for simplifying the exemplary analysis. The quadrature signals exhibit an I/Q gain imbalance ratio of "g" and I(Q phase imbalance of "e" radians. After passing through the image reject mixer circuit 104, the baseband signal, i.e. the down-mixed I signal 110 and the down-mixed Q signal 112, contains a baseband component whose magnitude is dominated by the size of I/Q gain and phase mismatches (i.e. sizes of "g" and "e"). It also contains a higher order component of the image signal (centered at 2 times the low IF frequency). However, this component is easily suppressed by the channel filter which is located next in a VLIF receiver lineup. (not shown) On the other hand, the components of the outputs which are dominated by the I/Q gain and phase mismatches cannot be removed later in the receive signal path since these components are already in the desired signal band. Hence, to achieve the cost/performance benefits of VLIF receivers, it is beneficial that the I/Q gain and phase imbalances be eliminated prior to the image reject mixer circuit 104. In summary, to achieve the necessary image rejection performance in VLIF receivers and preserve this performance over process, temperature, supply voltage, and channel frequency variations, it is beneficial is to employ the I/Q gain imbalance detection and correction circuit 96 and the I/Q phase imbalance detection and correction circuit 98 as illustrated in FIG. 2 prior to the image reject mixer circuit 104.

Figure 4:
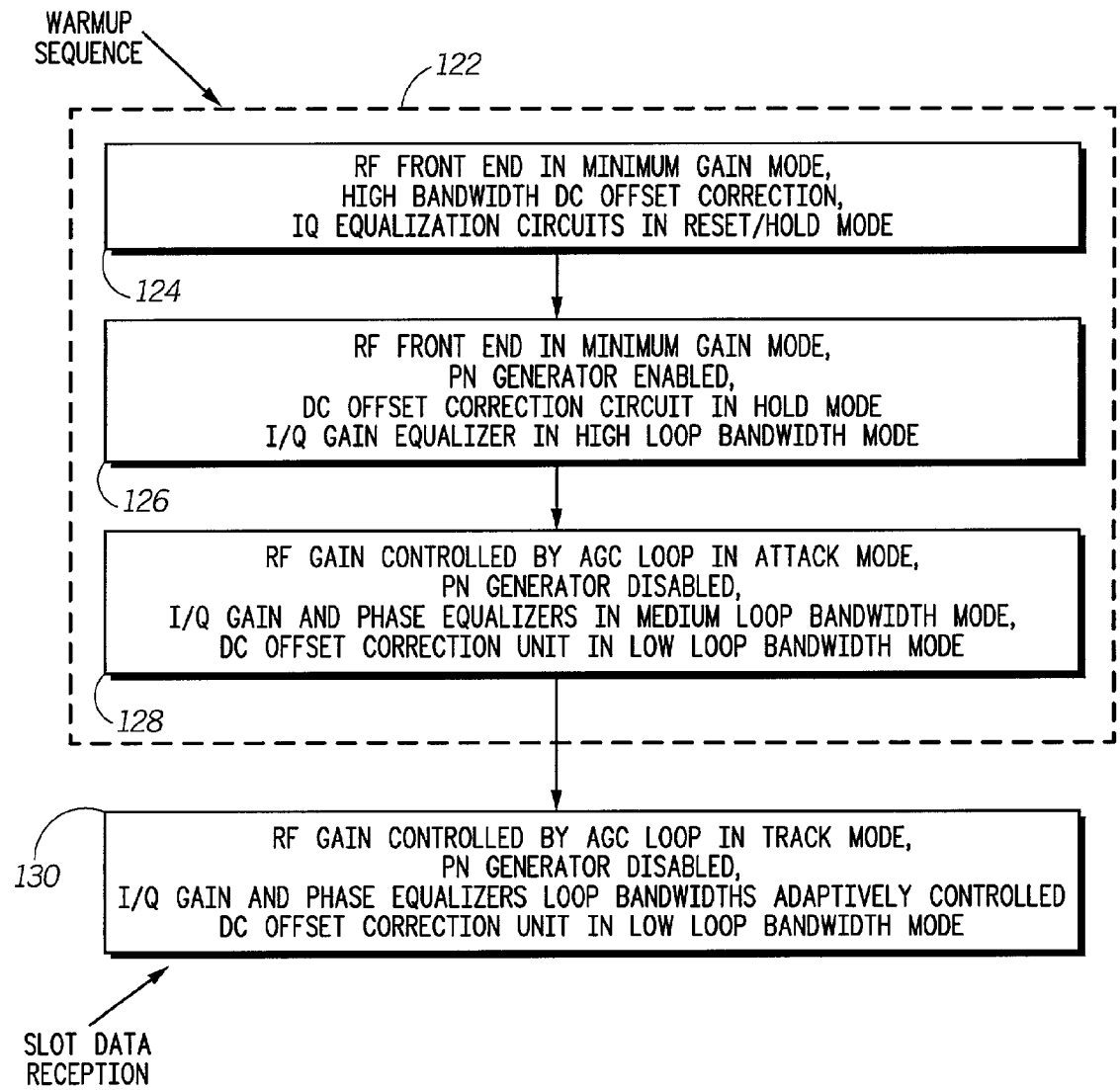
FIG. 4 is a flowchart illustrating the operation of the receiver of FIG. 2, in accordance with the preferred embodiment of the present invention.

FIG. 4 is a flowchart illustrating the operation of the receiver 50 of FIG. 2 in accordance with the preferred embodiment of the present invention. Specifically, the flowchart of FIG. 4 illustrates a warm-up sequence 122 of the receiver 50 after a sleep interval to support the adaptive and self-calibrating I/Q gain and phase imbalance correction mechanisms as described herein and in accordance with the present invention. The warm-up sequence 122 begins with Step 124 in which the RF front end line up is placed in a minimum gain mode to rapidly acquire front end coarse DC offsets in a high loop bandwidth mode. DC offset correction of the I and Q channels is performed first because independent DC offsets in each of these channels will otherwise degrade the I/Q gain and phase imbalance correction capability. This is because independent DC offsets in the I and Q channels manifests itself as appearing as gain imbalance to the specified I/Q correction circuit input. In addition, DC offsets at the input to the I/Q phase imbalance detection and correction circuit 98 degrades this circuit's performance since it relies heavily on the zero crossings of the cross-multiplied I and Q signals (i.e. the unequalized I-signal 80 and the unequalized Q-signal 94) to detect the I/Q phase imbalances. While the DC offset correction step is occurring, the I/Q phase imbalance detection and correction circuit 98 and the I/Q gain imbalance detection and correction circuit 96 can be either placed in a reset state or in a hold state depending upon whether the warm-up is after a power on condition or after a battery save interval, respectively. By placing the correction circuits in a hold state during and immediately after a battery save interval reduces the time to acquire the imbalances in situations where temperature and supply voltage has not altered significantly from prior to the battery save interval.

The next step in the warm-up sequence 122 is Step 126, in which I/Q gain equalization is performed using a self calibrating PN training signal (i.e. the I-channel digital PN training signal 76 and/or the Q-channel PN training signal 89). As mentioned previously, this is achieved by applying the I-channel digital PN training signal 76 at the input to the I-channel anti-aliasing filter 64 and applying the Q-channel digital PN training signal 89 to the input to the Q-channel anti-aliasing filter 82 so that I/Q gain imbalances due to these filters in addition to those imbalances due to the I-channel A/D 66 and the Q-channel A/D 84 can be quickly acquired during the warm-up process. This fast adaptation is achieved by keeping the RF lineup in a minimum gain mode (from previous Step 124) and by applying a strong PN calibration signal at the input to the anti aliasing filters (64, 82). By holding the RF gain at a minimum setting, a strong signal at the antenna will not interfere with the strong self-calibration signal. The I-channel digital offset correction circuit 70 and the Q-channel digital offset correction circuit 88 are placed in a hold mode during this equalization process so that there is no transient interference to the high loop bandwidth gain equalization process.

The final step, Step 128, in the warm-up sequence 122 (prior to slot data reception) is to perform I/Q phase imbalance correction. During this step, the PN generator 78 is disabled and the RF lineup, especially that prior to the I-quadrature mixer 54 and the Q-quadrature mixer 56, can be directly controlled by the Automatic Gain Control (AGC, not shown) in attack mode (i.e., high loop bandwidth mode). The AGC will provide either attenuation or gain to the RF gain lineup such that the signal level at the input to the I-channel A/D 66 and the Q-channel A/D 84 have sufficient head room to avoid clipping effects. The I/Q phase imbalance detection and correction circuit 98 then uses either a down converted signal or a down converted AWGN noise source (due to LNA, SAW filter, and VGA stages, not shown) to perform the specified phase imbalance correction. The I/Q phase imbalance detection and correction circuit 98 primarily uses the down converted AWGN noise when either a very weak or no signal is present at the antenna of the receiver 50 (not shown). As phase imbalance acquisition is performed, the I-channel digital offset correction circuit 70 and the Q-channel digital offset correction circuit 88 can be placed in a low loop bandwidth mode to acquire slowly varying DC offsets.

Following the warm-up sequence 122, in Step 130, the loop bandwidths of the I/Q phase imbalance detection and correction circuit 98 and the I/Q gain imbalance detection and correction circuit 96 are adaptively controlled on a slot-by-slot basis based upon the received signal strength. This allows for optimal performance in these correction circuits under both strong and weak signal conditions. The RF/IF gain lineup is controlled by the AGC loop running in track mode (or low loop bandwidth mode) during slot data reception mode.

Figure 5:
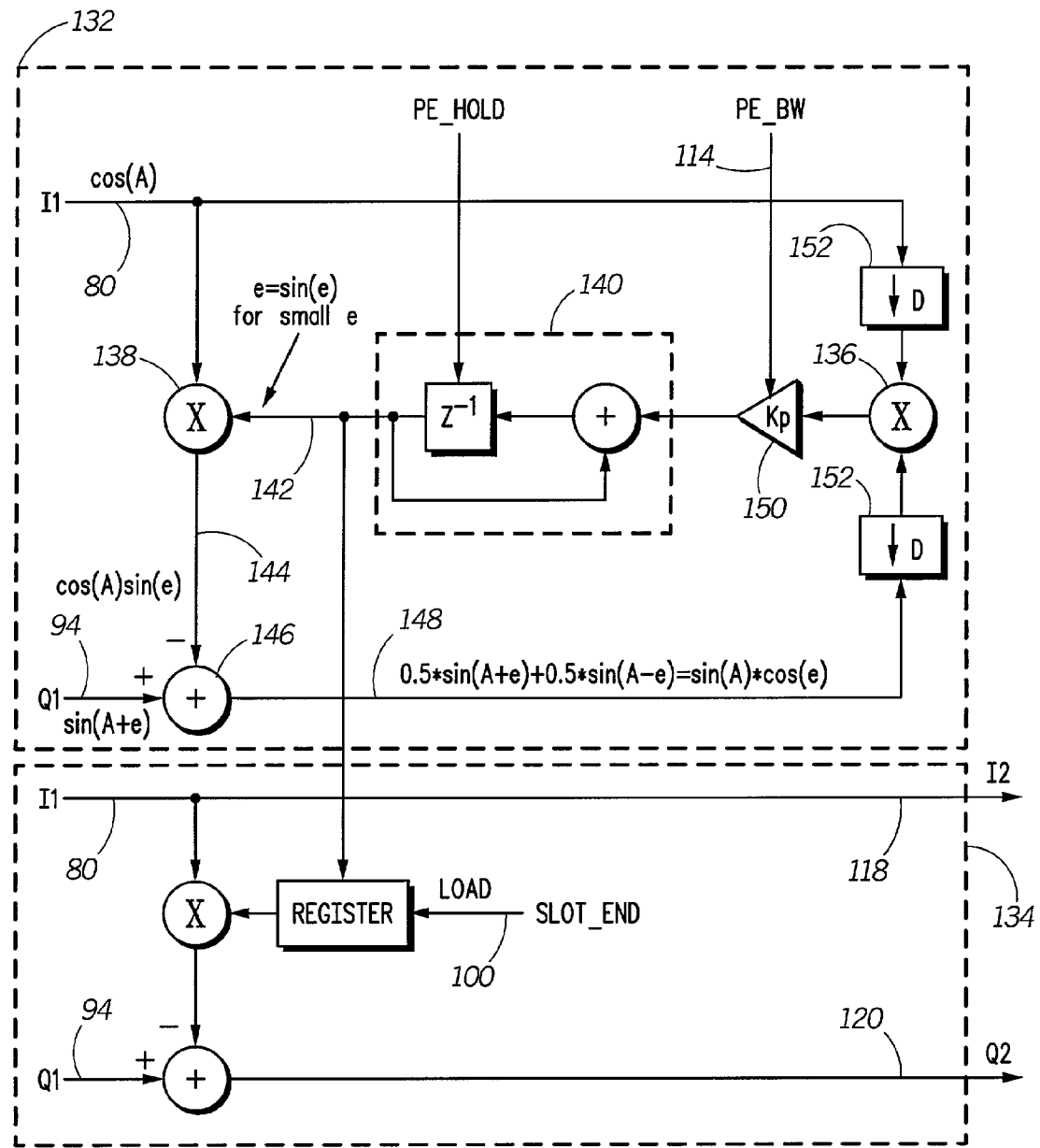
FIG. 5 illustrates a block diagram of an I/Q phase imbalance detection and correction circuit for use within the receiver of FIG. 2, in accordance with the preferred embodiment of the present invention.

FIG. 5 illustrates a block diagram of the I/Q phase imbalance detection and correction circuit 98 for use within the receiver 50 of FIG. 2, in accordance with the preferred embodiment of the present invention. As illustrated in FIG. 5, the I/Q phase imbalance detection and correction circuit 98 operates adaptively in a closed loop fashion. It will be appreciated by those of ordinary skill in the art that the multiplier elements (a first multiplier 136 and a second multiplier 138) as shown in FIG. 5 can alternatively be implemented using a single resource shared multiplier (with multiplexing at its inputs) and a higher rate clock source. This leads to reduced cost in the implementation.

The I/Q phase imbalance detection and correction circuit 98 is comprised of an I/Q phase imbalance correction loop 132 and a feed forward signal path 134 as illustrated. The I/Q phase imbalance correction loop 132 acquires the I/Q phase imbalance over a slot period. However, the result acquired by this loop is not applied to the feed forward signal path 134 until the end of the slot period (i.e.: the start of the next slot period).

The timing control for this is achieved using the SLOT_END control signal 100 as shown. The correction value is then held in the feed forward signal path 134 for the duration of that slot period. This approach ensures that the I/Q phase imbalance adaptation in the feed forward signal path 134 does not change dynamically over a slot period. Dynamic changes in the I/Q quadrature phase at the input to the signal detector (not shown) of the receiver 50 can make it difficult for the demodulator to track these relative phase changes over a slot period. This can lead to BER performance degradation. Hence, it is important to load a new phase imbalance correction value at the start of a slot period and then hold it over a slot period to avoid such effects.

The I/Q phase imbalance correction loop 132 operates as follows. The quadrature arms (i.e. the unequalized I-signal 80 and the unequalized Q-signal 94) are cross-multiplied using the first multiplier 136. The result is averaged using a leaky integrator 140 to generate an accumulated phase error 142 designated as "e" at the integrator output. The accumulated phase error 142 at the output of the leaky integrator 140 can be re-written as:

$$e = \text{Sin}(e)$$

for small "e".

The accumulated phase error 142 is then multiplied by the unequalized I-signal 80 using the second multiplier 138, yielding a multiplier result 144 mathematically depicted as:

$$\text{Cos}(A)\text{Sin}(e)$$

where "A" is the phase of the unequalized I-signal 80. Next, the multiplier result 144 is subtracted from the unequalized Q-signal 94 by a subtractor 146, yielding a subtractor result 148, mathematically depicted as:

$$\text{Sin}(A+e) - \text{Cos}(A)\text{Sin}(e)$$

$$= \text{Sin}(A+e) - (0.5 \times \text{Sin}(A+e) - 0.5 \times \text{Sin}(A-e))$$

$$= 0.5 \times \text{Sin}(A+e) + 0.5 \times (\text{Sin}(A-e))$$

The effect of this result is to rotate the unequalized Q-signal 94 (=Sin(A+e)) in the phasor plane in a direction such that the accumulated phase error (e) 142 adaptively reaches a minimal steady state error based upon the selection of the open loop gain. Note that once steady state is reached, there will again be a residual phase error due to the use of only a single pole leaky integrator for the leaky integrator 140. Proper selection of a gain term (Kp) 150, ensures that the steady state phase error will be smaller than that required. The gain term 150 for open loop can be made to be a power of 2 value, $2^{-j}$, where "j" is programmable. This eliminates the need for a multiplier to take into account the control loop gain.

The current drain in the I/Q phase imbalance correction loop 132 can be minimized by down sampling the unequalized I-signal 80 and the unequalized Q-signal 94 by a high down sample ratio (D) 152 as illustrated. For example, for a WCDMA application, the I/Q phase imbalance correction loop 132 can operate at sampling rates as low as 30 KHz since I/Q phase imbalances are not expected to change that fast. Thus, fast control loop adaptation can be achieved during a warm-up sequence by running the control loop at a high sampling rate (i.e. by using a low feedback down sample ratio). Next, current drain can be minimized during normal slot data reception mode by minimizing the control loop sampling rate (i.e. by using high feedback down sample ratio).

It is interesting to note that if further trigonometric simplification of the last equation is performed, it reduces to:

$$Q1 = \text{Sin}(A)\text{Cos}(e)$$

As can be seen from the last equation, a gain imbalance of Cos(e) is introduced. This gain imbalance is negligible for small "e". However, it is more noticeable for "e" greater that 10 degrees (gain imbalance>0.15 dB). The specified gain imbalances are, however, easily eliminated by the functionality of the I/Q gain imbalance detection and correction circuit 96 which is located next in the signal path of the receiver 50.

Figure 6:
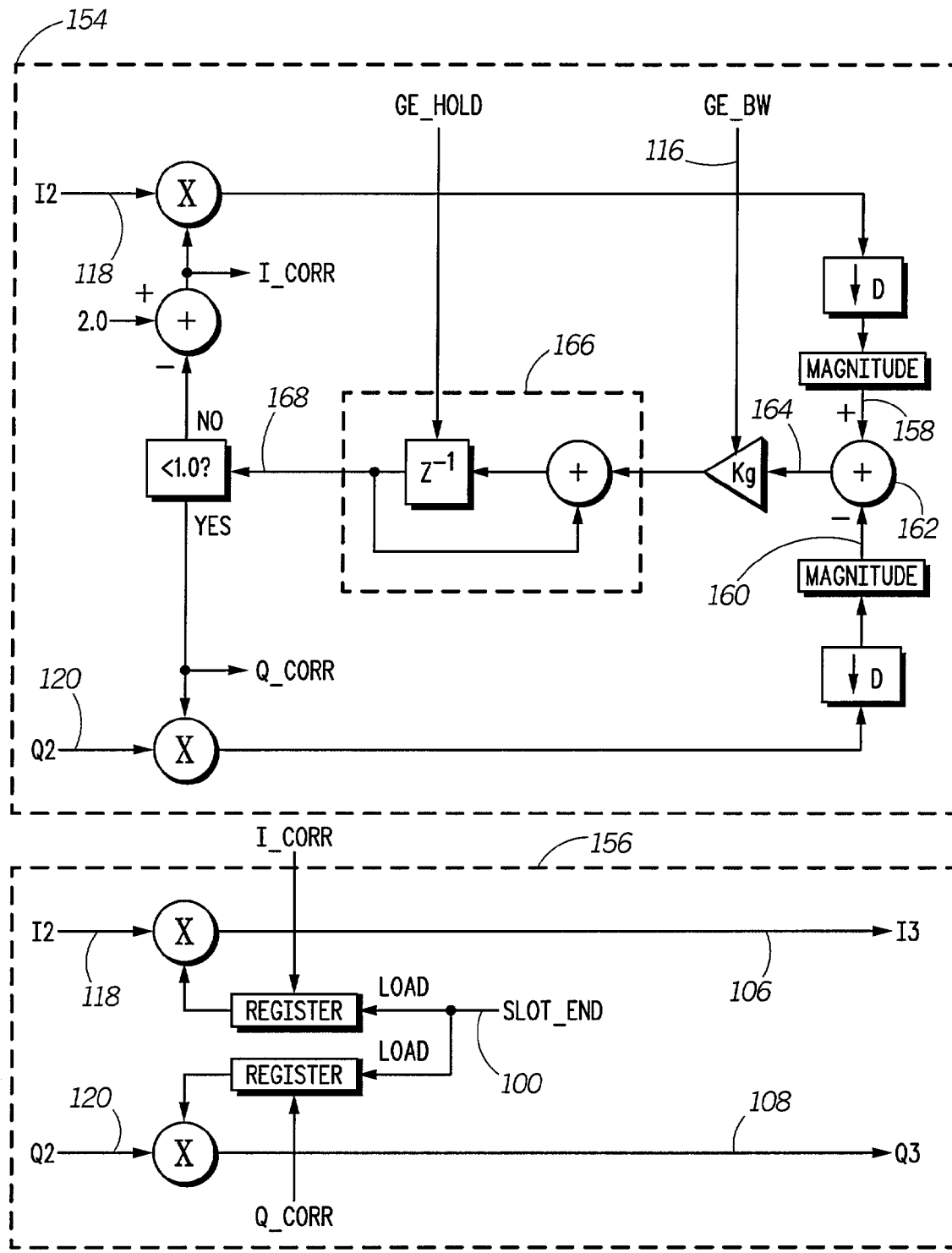
FIG. 6 illustrates a block diagram of an I/Q gain imbalance detection and correction circuit for use within the receiver of FIG. 2, in accordance with the preferred embodiment of the present invention.

FIG. 6 illustrates a block diagram of the I/Q gain imbalance detection and correction circuit 96 for use within the receiver 50 of FIG. 2, in accordance with the preferred embodiment of the present invention. The I/Q gain imbalance detection and correction circuit 96 preferably operates adaptively in a closed loop fashion. It will be appreciated by those of ordinary skill in the art that the multiplier elements as shown in FIG. 6 can alternatively be implemented using a single resource shared multiplier (with multiplexing at its inputs) and a higher rate clock source.

Similar to the topology of the I/Q phase imbalance detection and correction circuit 98, the I/Q gain imbalance detection and correction circuit 96 preferably includes an I/Q gain correction feedback loop 154 and a phase equalized feed forward signal path 156. FIG. 6 illustrates how I/Q gain imbalance is acquired over a slot period. However, the result is not applied to the phase equalized feed forward signal path 156 until the end of the slot period (as triggered by the SLOT_END control signal 100). The correction value is then held in the phase equalized feed forward signal path 156 for the duration of a given slot period. This approach ensures that the I/Q gain imbalance adaptation in the phase equalized feed forward signal path 156 does not change dynamically over a slot period. Dynamic changes in the I/Q relative gain at the input to the receiver's demodulator can make it difficult for the demodulator to track these relative gain changes over a slot period. This can lead to BER performance degradation. Hence, it is important to load a new gain imbalance correction value at the start of a slot period and then hold it over a slot period to avoid such effects.

The I/Q gain imbalance detection and correction circuit 96 functions as follows. A gain equalization subtractor 162 outputs a difference 164 between an absolute value I-signal 158 and an absolute value Q-signal 160 (or magnitudes). The difference 164 is averaged using a gain equalization leaky integrator 166. An averaged magnitude error 168 is then used to continuously adjust the gain of either the I or Q feed forward channel until the steady state gain error approaches a negligible value. Note that since only a single pole leaky integrator is employed for the gain equalization leaky integrator 166, there will result a small steady state residual imbalance error based upon the selection of the open loop gain (Km). Proper selection of the open loop gain during warm-up and data reception operation modes ensures that the residual error will be less than that required.

As shown in FIG. 6, depending upon whether the averaged magnitude error 168 at the output of the gain equalization leaky integrator 166 is greater or less than unity, gain correction is applied either to the phase equalized I-signal 118 or the phase equalized Q-signal 120. When the averaged magnitude error 168 is less than unity, the phase equalized Q-signal 120 is adjusted. Alternately, when the averaged magnitude error 168 is greater than unity, the phase equalized I-signal 118 is adjusted by using the reciprocal of the averaged magnitude error 168 as the correction term. This ensures that clipping will never occur in either the I or the Q signal path by ensuring that the correction value applied to either path is always less than unity. Signal clipping in the control loop introduces non-linearities and additional noise into the correction loop. This can lead to significant performance degradation in the loop dynamics and the final correction results. This type of performance degradation is avoided by dynamically adjusting I or Q channels on a sample-by-sample basis based upon the size of the correction value at the output of the gain equalization leaky integrator 166.

It is also worthwhile mentioning here that the reciprocal operation shown above for adjusting the unequalized I-signal 80 is implemented in a cost and current drain efficient manner by using a following first order binomial approximation $(1.0/(1.0 +/-x) = 1.0 -/+ x$ where "x" reflects a relative gain imbalance with respect to unity gain). This approximation provides acceptable performance in the control. Hence, expensive and power hungry divider type circuits are not needed in this invention.

Figure 7:
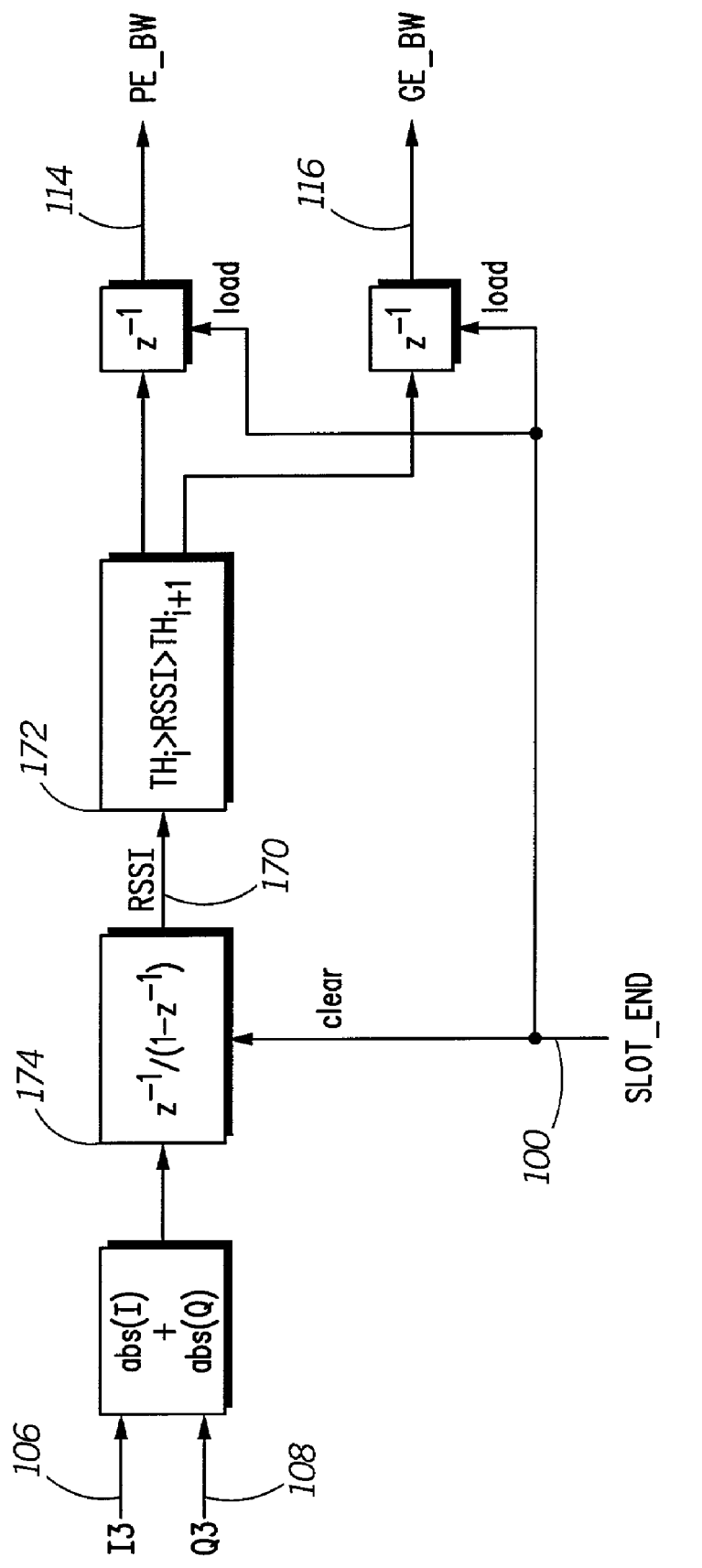
FIG. 7 illustrates a block diagram of an adaptive loop bandwidth control unit for use within the receiver of FIG. 2, in accordance with the preferred embodiment of the present invention.

FIG. 7 illustrates a block diagram of the adaptive loop bandwidth control circuit 102 for use within the receiver 50 of FIG. 2, in accordance with the preferred embodiment of the present invention. The loop bandwidths of the I/Q gain imbalance detection and correction circuit 96 and the I/Q phase imbalance detection and correction circuit 98 can be controlled effectively on a slot-by-slot basis to achieve optimal acquisition performance. By performing this adaptive loop bandwidth control using this simple, low cost architecture—the specified control loops will achieve faster and more accurate correction performance under different and varying channel conditions. Under stronger signal conditions, lower loop bandwidths can be used while higher loop bandwidths can be employed during weaker signal conditions. This adaptive loop bandwidth control leads to higher resolution and faster overall acquisition performance in the I/Q correction loops under varying channel conditions.

The adaptive loop bandwidth control circuit 102 operates as follows. First, an estimate of a Received Signal Strength Indicator 170 (RSSI) is measured over a slot period at the output of the I/Q gain imbalance detection and correction circuit 96 and the I/Q phase imbalance detection and correction circuit 98. After that, the slot RSSI 170 estimate is compared to programmable threshold levels to determine the loop bandwidths for the phase equalizer (the PE_BW 116) and the gain equalizer (the GE_BW 114) during the next slot period using a comparator 172. The timing for the specified functionality is achieved using the SLOT_END control signal 100. It is used to reset a RSSI integrator 174 at the start of the next slot period and to load the specified loop bandwidths into loadable registers at the same timing marker.

Although the invention has been described in terms of preferred embodiments, it will be obvious to those skilled in the art that various alterations and modifications can be made without departing from the invention. Accordingly, it is intended that all such alterations and modifications be considered as within the spirit and scope of the invention as defined by the appended claims.

What is claimed is:

1. A receiver for receiving a radio frequency signal, the receiver having a self-calibrating receive path correction system for correction of an I/Q gain imbalance and an I/Q phase imbalance in the radio frequency signal, the receiver comprising:

a signal-processing block for processing the received radio frequency signal, thereby producing an unequalized I-signal and an unequalized Q-signal, wherein the signal processing block includes digital offset correction during the processing of the received radio frequency signal;

an I/Q phase imbalance detection and correction circuit coupled to the signal-processing block for equalizing a phase of the unequalized I-signal and a phase of the unequalized Q-signal, thereby producing a phase equalized I-signal and a phase equalized Q-signal;

an I/Q gain imbalance detection and correction circuit coupled to the I/Q phase imbalance detection and correction circuit for equalizing a gain of the phase equalized I-signal and a gain of the phase equalized Q-signal, thereby producing an I-image signal and a Q-image signal;

an adaptive loop bandwidth control circuit coupled to the I/Q phase imbalance detection and correction circuit and to the I/Q gain imbalance detection and correction circuit for dynamically adjusting at least one loop bandwidth for the I/Q gain imbalance detection and correction circuit and the I/Q phase imbalance detection and correction circuit on at least one slot boundary; and wherein an at least one PN training signal is used for a self-calibration of the I/Q phase imbalance detection and correction circuit and the I/Q gain imbalance detection and correction circuit during a warm-up sequence to compensate for imbalances due to the signal-processing block.

2. A receiver as recited in claim 1 wherein the I/Q gain imbalance detection and correction circuit and the I/Q phase imbalance detection and correction circuit each use a SLOT_END control signal to detect the specified imbalances over a slot period, wherein the correction values are applied at the start of the next slot period.

3. A receiver as recited in claim 1 further comprising:
an image reject mixer circuit coupled to an output of the I/Q gain imbalance detection and correction circuit for downmixing the I-image signal and the Q-image signal, thereby producing a down-mixed I signal and a down-mixed Q-signal.

4. A receiver as recited in claim 1 comprising a zero intermediate frequency topology at baseband.

5. A receiver as recited in claim 1 comprising a very low intermediate frequency topology at baseband.

6. A receiver as recited in claim 1 wherein the signal-processing block comprises:
a local oscillator;
an I-quadrature mixer coupled to the local oscillator for down converting the radio frequency signal, thereby producing an I-signal component;
an I-channel anti-aliasing filter coupled to the I-quadrature mixer for attenuating out of band frequencies of the I-signal component, thereby producing an I-channel filtered signal;
an I-channel analog to digital converter coupled to the I-channel anti-aliasing filter for converting the I-channel filtered signal from an analog format to a digital format, thereby producing an I-channel digital signal;
an I-channel digital offset correction circuit coupled to the I-channel analog to digital converter for correcting for DC offsets of the I-channel digital signal created at the input to the I-channel anti-aliasing filter, thereby producing the unequalized I-signal;
an I-channel feedback path coupled between an output of the I-channel digital offset correction circuit and an input to the I-channel anti-aliasing filter to correct for the analog offsets at the input to the I-channel anti-aliasing filter, wherein the I-channel feedback path includes an I-channel digital PN training signal;
a Q-quadrature mixer coupled to the local oscillator for down converting the radio frequency signal, thereby producing a Q-signal component;
a Q-channel anti-aliasing filter coupled to the Q-quadrature mixer for attenuating out of band frequencies of the Q-signal component, thereby producing a Q-channel filtered signal;
a Q-channel analog to digital converter coupled to the Q-channel anti-aliasing filter for converting the Q-channel filtered signal from an analog format to a digital format, thereby producing a Q-channel digital signal;
a Q-channel digital offset correction circuit coupled to the Q-channel analog to digital converter for correcting for DC offsets of the Q-channel digital signal created at the input to the Q-channel anti-aliasing filter, thereby producing the unequalized Q-signal; and
a Q-channel feedback path coupled between an output of the Q-channel digital offset correction circuit and an input to the Q-channel anti-aliasing filter to correct for the analog offsets at the input to the Q-channel anti-aliasing filter, wherein the Q-channel feedback path includes a Q-channel digital PN training signal.

7. A receiver for receiving a radio frequency signal, the receiver having a self-calibrating receive path correction system for correction of an I/Q gain imbalance and an I/Q phase imbalance in the radio frequency signal, the receiver comprising:
a signal-processing block for processing the received radio frequency signal, thereby producing an unequalized I-signal and unequalized Q-signal;
an I/Q phase imbalance detection and correction circuit coupled to the signal-processing block for equalizing a phase of the unequalized I-signal and a phase of the unequalized Q-signal, thereby producing a phase equalized I-signal and a phase equalized Q-signal wherein the I/Q phase imbalance detection and correction circuit comprises:
an I/Q phase imbalance correction loop; and
a feed forward signal path coupled to the I/Q phase imbalance correction loop, wherein the I/Q phase imbalance correction loop acquires an I/Q phase imbalance over a slot period, and further wherein the I/Q phase imbalance acquired is applied at the end of the slot period:
an I/Q gain imbalance detection and correction circuit coupled to the I/Q phase imbalance detection and correction circuit for equalizing a gain of the phase equalized I-signal and a gain of the phase equalized Q-signal, thereby producing an I-image signal and a Q-image signal; and
an adaptive loop bandwidth control circuit coupled to the I/Q phase imbalance detection and correction circuit and to the I/Q gain imbalance detection and correction circuit for dynamically adjusting at least one loop bandwidth for the I/Q gain imbalance detection and correction circuit and the I/Q phase imbalance detection and correction circuit on at least one slot boundary.

8. A receiver as recited in claim 7 wherein the I/Q phase imbalance correction loop comprises:
a first multiplier for cross-multiplying the unequalized I-signal and the unequalized Q-signal,
a leaky integrator coupled to the first multiplier for averaging an output of the first multiplier to generate an accumulated phase error,
a second multiplier coupled to the output of the leaky integrator for multiplying the accumulated phase error by the unequalized I-signal, yielding a multiplier result, and
a subtractor coupled to the second multiplier for subtracting the multiplier result from the unequalized Q-signal thereby rotating the unequalized Q-signal in a phasor plane in a direction such that the accumulated phase error adaptively reaches a minimal steady state error.

9. A receiver for a radio frequency signal, the receiver having a self-calibrating receive that correction system for correction of an I/Q gain imbalance and an I/Q phase imbalance in the radio frequency signal, the receiver comprising:
- a signal-processing block for processing the received radio frequency signal, thereby producing an unequalized I-signal and an unequalized Q-signal;
- an I/Q phase imbalance detection and correction circuit coupled to the signal-processing block for equalizing a phase of the unequalized I-signal and a phase of the unequalized Q-signal, thereby producing a phase equalized I-signal and a phase equalized Q-signal;
- an I/Q gain imbalance detection and correction circuit coupled to the I/Q phase imbalance detection and correction circuit for equalizing a gain of the equalized I-signal and a gain of the phase equalized Q-signal, thereby producing an I-image signal and a Q-image signal wherein the I/Q gain imbalance detection and correction circuit comprises:
- an I/Q gain correction feedback loop; and
- a phase equalized feed forward signal path coupled to the I/Q gain correction feedback loop, wherein the I/Q gain correction feedback loop acquires an I/Q gain correction over a slot period, and further wherein the acquired I/Q gain correction is applied to the phase equalized feed forward signal path at the end of the slot period; and
- an adaptive loop bandwidth control circuit coupled to the I/Q phase imbalance detection and correction circuit and to the I/Q gain imbalance detection and correction circuit for dynamically adjusting at least one loop bandwidth for the I/Q gain imbalance detection and correction circuit and the I/Q phase imbalance detection and correction circuit on at least one slot boundary.

10. A receiver as recited in claim 9 wherein the I/Q gain correction feedback loop comprises:
- a gain equalization subtractor for calculating a difference between an absolute value I-signal and an absolute value Q-signal, and
- a gain equalization leaky integrator coupled to the gain equalization subtractor for averaging the difference, thereby producing an averaged magnitude error, wherein the averaged magnitude error is used to adjust a gain of the phase equalized feed forward signal path.

11. A receiver as recited in claim 10 wherein the averaged magnitude error is applied to a phase equalized Q-signal of the phase equalized feed forward signal path when the averaged magnitude error is less than unity.

12. A receiver as recited in claim 10 wherein the reciprocal of the average magnitude error is applied to a phase equalized I-signal of the phase equalized feed forward signal path when the averaged magnitude error is greater than unity.

13. A method for correction of an I/Q gain imbalance and an I/Q phase imbalance in a received radio frequency signal using a self-calibrating receive path correction system, the method comprising:
- performing a warm-up sequence of the receiver, the warm up sequence including the steps of performing a digital offset correction of an I-signal component and a Q-signal component of the received radio frequency signal in a high loop bandwidth mode, thereby producing an unequalized I-signal and an unequalized Q-signal, equalizing an I/Q gain of the unequalized I-signal and the unequalized Q-signal using a self calibrating PN training signal, and equalizing an I/Q phase of the unequalized I-signal and the unequalized Q-signal using a self calibrating PN training signal; and
- adaptively controlling at least one loop band width of the I/Q phase imbalance detection and correction circuit and the I/Q gain imbalance detection and correction circuit on a slot-by-slot basis based upon the received signal strength.

14. A method as recited in claim 13 wherein the warm-up sequence occurs after a power on condition of the receiver, and further wherein during the digital offset correction step, the I/Q phase imbalance detection and correction circuit and the I/Q gain imbalance detection and correction circuit are in a reset state.

15. A method as recited in claim 13 wherein the warm-up sequence occurs after a battery save interval of the receiver, and further wherein during the digital offset correction step, the I/Q phase imbalance detection and correction circuit and the I/Q gain imbalance detection and correction circuit are in a hold state.

* * * * *